(12) United States Patent
Chen et al.

(10) Patent No.: US 8,174,004 B2
(45) Date of Patent: May 8, 2012

(54) ORGANIC THIN FILM TRANSISTOR, METHOD OF FABRICATING THE SAME, AND GATE INSULATING LAYER USED IN THE SAME

(75) Inventors: Sheng-Wei Chen, Hsin-Chu (TW); Chung-Hua Wang, Hsin-Chu (TW); Jenn-Chang Hwang, Hsin-Chu (TW)

(73) Assignee: National Tsing Hua University (TW)

( * ) Notice: Subject to any disclaimer, the term of this patent is extended or adjusted under 35 U.S.C. 154(b) by 351 days.

(21) Appl. No.: 12/585,422

(22) Filed: Sep. 15, 2009

(65) Prior Publication Data

US 2010/0230662 A1    Sep. 16, 2010

(30) Foreign Application Priority Data

Mar. 13, 2009    (TW) ................ 98108142 A

(51) Int. Cl.
*H01L 35/24* (2006.01)
(52) U.S. Cl. .................................. 257/40; 257/E51.001
(58) Field of Classification Search .................... 257/40, 257/E51.001
See application file for complete search history.

*Primary Examiner* — Anthony Ho
(74) *Attorney, Agent, or Firm* — Bacon & Thomas, PLLC

(57) ABSTRACT

An organic thin film transistor is disclosed, which comprises an azole-metal complex compound used as the gate insulating layer. The method of making the self-assembled gate insulating layer is a water-based processing method that enables the azole-metal complex compound to be self-formed on the patterned gate electrode in a water-based solution and serves as a gate insulating layer. The organic thin film transistor (OTFT) of the present invention comprises the azole-metal complex compound used in the gate insulating layer, therefore can be manufactured in a simple, quick, easy way for large quantities, and low cost.

13 Claims, 7 Drawing Sheets

ORGANIC THIN FILM TRANSISTOR, METHOD OF FABRICATING THE SAME, AND GATE INSULATING LAYER USED IN THE SAME

BACKGROUND OF THE INVENTION

1. Field of the Invention

The present invention relates to an organic thin film transistor, a method of fabricating the same, and a gate insulating layer used in the same and, more particularly, to an organic thin film transistor comprising an azole-metal complex compound, a method of fabricating the same, and a gate insulating layer used in the same.

2. Description of Related Art

Thin film transistors (TFTs) are fundamental components in contemporary electronics, including, for example, sensors, image scanners, and electronics display devices. Usually, in manufacturing a display device, cost is a critical point directing the development of the research. Manufacturers urge that high quality displays should also be produced with a lower cost.

Organic thin film transistors (OTFTs) are advantageous in their low producing cost, rollability, and large area and have drawn much attention of the researchers. OTFTs can be divided into top contact OTFTs and bottom OTFTs according to their structure. A top contact OTFT is generally composed of a substrate 10; a gate electrode 11 formed on the substrate 10; a gate insulating layer 12 formed on the gate electrode 11, an organic semiconductor layer 13 formed on and covering the whole gate insulating layer 12, and a source electrode 14 and a drain electrode 15 formed on the organic semiconductor layer 13, as shown in FIG. 1.

Referring to FIG. 2, in which a bottom contact OTFT is shown, a conventional bottom contact OTFT is generally composed of a substrate 10; a gate electrode 11 formed on the substrate 10; a gate insulating layer 12 formed on the gate electrode 11; a source electrode 14 and a drain electrode 15 formed on the gate insulating layer 12; and an organic semiconductor layer 13 formed on and covering the source electrode 14, the drain electrode 15, and the gate insulating layer 12.

According to a conventional method of forming a gate insulating layer of an OTFT, coating process or printing process is usually applied. However, the cost of the equipment for these processes is high, and the uniformity of the obtained coated film cannot be satisfied when applied to large area production, and moreover, excessive steps of photolithography should be taken when a coating process is applied. The maintenance cost of the precision instrument for printing process is a great burden. Therefore, many efforts have been spent on developing a novel OTFT that can be fabricated in a low-cost, simple, and environmentally-friendly method.

Azole compounds such as imidazoles, benzimidazoles, or benzotriazoles have been widely used in the organic solderability preservation (OSP) coatings in the conventional printed circuit board manufacturing process and in the soldering materials of chip packaging process (see U.S. Pat. Nos. 5,858,074, 3,295,917, 3,891,470, 3,933,531, 4,373,656, and 5,173,130). OSP coatings are used to provide protection against copper solderability degradation caused by various process steps in fabrication process such as exposure to multiple heat cycles during electronic component fabrication for surface mount technology and mixed technology printed wiring boards assembly.

However, there is no mention about applying such azole compounds to the forming of the gate insulating layer in an electric element such as transistors. Unlike organic solderability preservation (OSP) coatings, insulating layers are more difficult to be formed. Electrical characteristics, which may be largely influenced by the thickness, surface roughness, composition of the insulating film, are the main requirements that should be taken into consideration instead of physical characteristics such as protecting ability. If a new material is applied but destroys the original function of the electrical element such as transistors, the induction of such material fails. Therefore, the technique of forming the insulating layer is more difficult than that of forming the organic solderability preservation (OSP) coatings.

In fact, many prior arts have disclosed the usage of azole compounds in the forming of organic solderability preservation (OSP) coatings, however none of them ever taught the forming of an insulating layer with azole compounds.

SUMMARY OF THE INVENTION

The present invention provides an organic thin film transistor comprising: a substrate; a gate electrode located on the substrate; a gate insulating layer located on the gate electrode, wherein the gate insulating layer comprises an azole-metal complex compound; a source electrode; a drain electrode; and an organic semiconductor layer; wherein the source electrode, the drain electrode, and the organic semiconductor layer are located over the gate insulating layer.

The organic thin film transistor (OTFT) of the present invention comprises an azole-metal complex compound used in the gate insulating layer, which can be self-assembled on the gate electrode by a water-based processing method, hence the gate insulating layer can be fabricated without the use of a coating or printing process. Therefore, the OTFT of the present invention can be manufactured in a simple, quick, easy way for large quantities, and low cost.

According to the organic thin film transistor of the present invention, the azole-metal complex compound preferably is selected from the group consisting of: an imidazole-metal complex compound, a benzimidazole-metal complex compound, a benzotriazole-metal complex compound, and the mixture thereof, more preferably is a 2-substituted benzimidazol-metal complex, but is not limited thereto.

According to the organic thin film transistor of the present invention, the metal of the azole-metal complex compound is preferably a metal contained in the gate electrode, and the metal of the azole-metal complex compound is preferably selected from the group consisting of: Cu, Cr, Mn, Fe, Co, Ni, Zn, Pd, Ag, Pt, Au, and Al, but is not limited thereto.

According to the organic thin film transistor of the present invention, the organic thin film transistor is preferably a top contact organic thin film transistor, in which the organic semiconductor layer covers the whole gate insulating layer, and the source electrode and the drain electrode locate on the organic semiconductor layer; or preferably a bottom contact organic thin film transistor, in which the source electrode and the drain electrode locate on the gate insulating layer, and the organic semiconductor layer covers the source electrode, the drain electrode, and the gate insulating layer.

The organic thin film transistor of the present invention preferably further comprises a modification layer located between the gate insulating layer and the organic semiconductor layer to improves interfacial properties between the organic semiconductor layer and the gate insulating layer. The modification layer is preferably made of one selected from the group consisting of: polymethylmethacrylate (PMMA), poly(vinyl alcohol) (PVA), poly(vinyl pyrrolidone) (PVNP), polyfluorene (PF), poly(vinylidene fluoride)

(PVDF), polyimide (PI), polyethyleneimine (PEI), and polystyrene (PS), but is not limited thereto.

According to the organic thin film transistor of the present invention, the gate electrode is preferably made of one selected from the group consisting of: Cu, Cr, Mn, Fe, Co, Ni, Zn, Pd, Ag, Pt, Au, and Al, but is not limited thereto.

According to the organic thin film transistor of the present invention, the gate insulating layer preferably has a multi-layered structure.

According to the organic thin film transistor of the present invention, the material of the organic semiconductor layer is not specially limited, any materials used in the prior arts for forming the organic semiconductor layer can be used here, for example, materials such as pentacene, fullerene, Poly(3-hexylthiophene) (P3 HT), Phenyl-$C_{61}$-Butyric-Acid-Methyl-Ester (PCBM), or the derivatives thereof can be used here to form the organic semiconductor layer.

The present invention also provides a method of fabricating an organic thin film transistor (OTFT), which comprises: (S1) providing a substrate; (S2) forming a gate electrode on the substrate; (S3) providing an azole acidic solution containing an azole compound and an acid; (S4) immersing the substrate having the gate electrode thereon in the said azole acidic solution to form a gate insulating layer on the gate electrode; and (S5) forming an organic semiconductor layer, a source electrode, and a drain electrode over the gate insulating layer.

According to the method of fabricating an organic thin film transistor of the present invention, the gate insulating layer comprising the azole-metal complex compound can be self-assembled on the gate electrode. The method of making the self-assembled gate insulating layer is a water-based processing method that enables the azole-metal complex compound to be self-formed on the patterned gate electrode in a water-based solution without the using of coating or printing process. In this connection, the method of the present invention enables the fabrication of an insulating layer to be processed in a simple way and the equipment utilized herein is low cost, which cannot be obtained by the prior arts.

According to the method of fabricating an organic thin film transistor of the present invention, preferably the organic semiconductor layer may cover the whole gate insulating layer, and the source electrode and the drain electrode may be formed on the organic semiconductor layer to achieve a top contact OTFT. Alternatively, the source electrode and the drain electrode preferably may be formed on the gate insulating layer, and the organic semiconductor layer may be formed covering the source electrode, the drain electrode, and the gate insulating layer to achieve a bottom contact OTFT.

The method of fabricating an organic thin film transistor of the present invention may preferably further comprise a step (S41) after step (S4), wherein the step (S41) comprises: forming a modification layer on the gate insulating layer. The modification layer improves interfacial properties between the organic semiconductor layer and gate insulating layer. The modification layer may be preferably made of one selected from the group consisting of: polymethylmethacrylate (PMMA), poly(vinyl alcohol) (PVA), poly(vinyl pyrrolidone) (PVNP), polyfluorene (PF), poly(vinylidene fluoride) (PVDF), polyimide (PI), polyethyleneimine (PEI), and polystyrene (PS).

According to the method of fabricating an organic thin film transistor of the present invention, the azole compound of step (S3) preferably is selected from the group consisting of: an imidazole compound, a benzimidazole compound, a benzotriazole compound, and the mixture thereof, more preferably is 2-substituted benzimidazol, but is not limited thereto.

According to the method of fabricating an organic thin film transistor of the present invention, the pH value of the azole acidic solution of step (S3) is preferably 1-8, but is not limited thereto.

According to the method of fabricating an organic thin film transistor of the present invention, the gate electrode of step (S2) is preferably made of metal selected from the group consisting of: Cu, Cr, Mn, Fe, Co, Ni, Zn, Pd, Ag, Pt, Au, and Al, but is not limited thereto.

The present invention also provides a gate insulating layer, which comprises an azole-metal complex compound, wherein the gate insulating layer is used in an organic thin film transistor, the metal of the azole-metal complex compound is a metal contained in the gate electrode, and the metal of the azole-metal complex compound is selected from the group consisting of: Cu, Cr, Mn, Fe, Co, Ni, Zn, Pd, Ag, Pt, Au, and Al, but is not limited thereto.

According to the gate insulating layer of the present invention, the azole-metal complex compound preferably is selected from the group consisting of: an imidazole-metal complex compound, a benzimidazole-metal complex compound, a benzotriazole-metal complex compound, and the mixture thereof, more preferably is a 2-substituted benzimidazole-metal complex, but is not limited thereto.

The gate insulating layer of the present invention is a self-assembled gate insulating layer composed of an azole-metal complex compound, which can be easily formed on a gate electrode of an OTFT. The method of making the self-assembled gate insulating layer is a water-based processing method that enables the azole-metal complex compound to be self-formed on the patterned gate electrode in a water-based solution and serves as a gate insulating layer. Therefore, there is no need of any process with expensive equipment (such as spin-coating process, jet-printing process, etc), since the process of producing an OTFT according to the present invention is simplified, and the costs of the raw materials and equipment are extremely low.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Example 1

Forming of the Gate Electrode

A transparent flexible PET (poly(ethylene terephtalate)) plastic film is ultrasonically cleaned with de-ionized (DI) water following by taken for thermal evaporation with a patterned mask. The conditions used during the thermal evaporation are listed below.

Pressure: $5 \times 10^{-6}$ torr;
Evaporating rate: 0.5 to 1 Å/s;
Thickness of the film: 50 to 100 nm.

After thermal evaporation, a patterned copper metallic film as the gate electrode is thus formed on the PET substrate.

Forming of the Gate Insulating Layer

An azole acidic solution is prepared by dissolving 2-heptyl benzimidazole and acetic acid in de-ionized (DI) water, in which the pH value of the azole acidic solution is adjusted to 3, and the concentration of the 2-heptyl benzimidazole is 0.1 to 5 wt/ml %. At a temperature of 40° C., the above prepared PET substrate comprising the patterned gate electrode formed thereon is immersed in the azole acidic solution for 1.5 minutes. A self-assembled benzimidazole-copper complex (SABCC) gate insulating layer is thus self-forming on the patterned copper gate electrode. Herein, the thickness of the SABCC gate insulating layer can be controlled by repeating the immersion step once or more times.

Forming of the Organic Semiconductor Layer

The pentacene material obtained commercially is used as the material for forming the organic semiconductor layer of the present example. Through a shadow metal mask, pentacene is deposited on the SABCC gate insulating layer by thermal evaporation at 70° C. The detailed conditions used during the deposition of the pentacene are listed below.

Pressure: $3 \times 10^{-6}$ torr;
Evaporating rate: 0.3 Å/s;
Thickness of the pentacene film: 100 nm.

Forming of the Source Electrode and the Drain Electrode

By using a thermal evaporation method, a patterned gold (Au) layer is deposited through a shadow metal mask to define a source electrode and a drain electrode. The conditions of the thermal evaporation processing are as listed below.

Pressure: $5 \times 10^{-6}$ torr;
Evaporating rate: 1 Å/s;
Thickness of the patterned gold (Au) layer: 80 to 100 nm.

With the finishing of the above steps, a top contact OTFT of the present example is provided.

Figure 1:
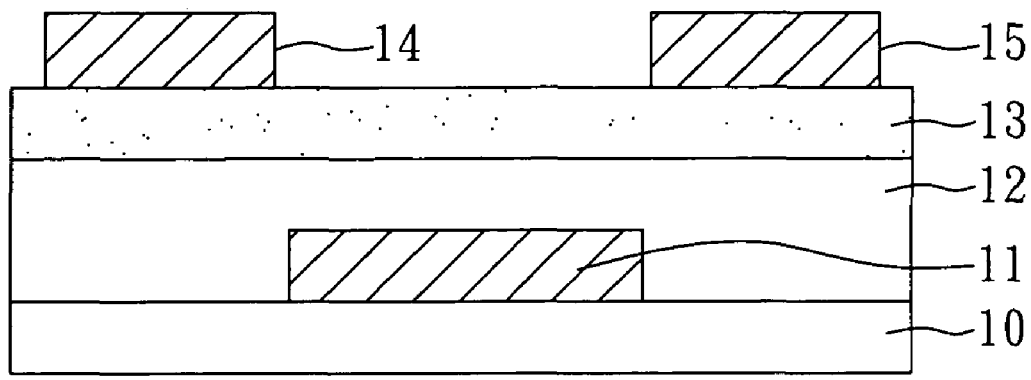
FIG. 1 is a schematic view of a conventional top contact OTFT.
Figure 2:
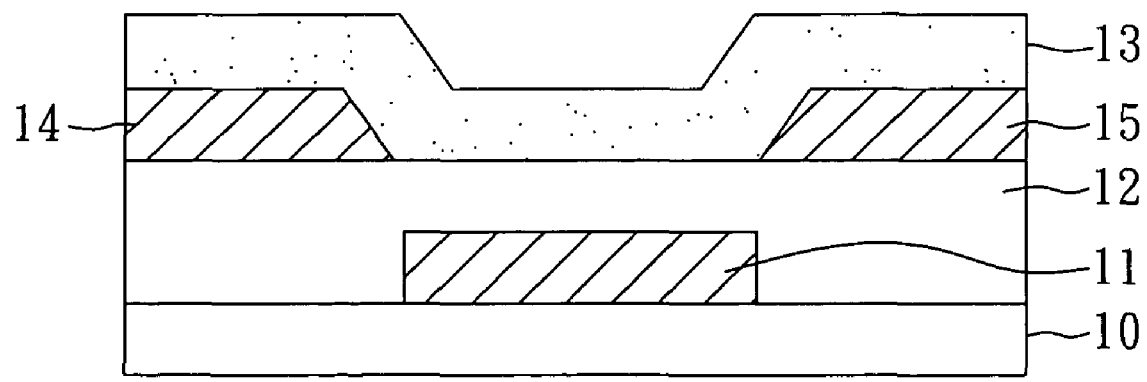
FIG. 2 is a schematic view of a conventional bottom contact OTFT.
Figure 3:
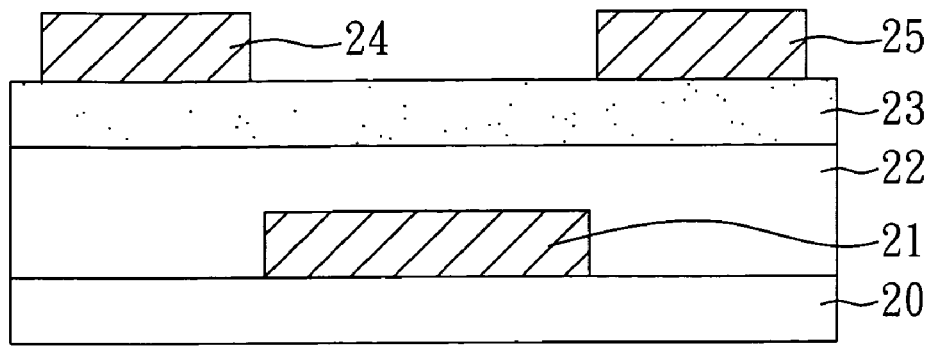
FIG. 3 is a schematic view of a top contact OTFT of example 1 of the present invention.

Referring to FIG. 3, a schematic view of a top contact OTFT of the present example is shown. The top contact OTFT of the present example comprises a substrate 20; a gate electrode 21 located on the substrate 20; a gate insulating layer 22 located on the gate electrode 21; an organic semiconductor layer 23 located on and covering the gate insulating layer 22; and a source electrode 24 and a drain electrode 25 located on the organic semiconductor layer 23, in which the gate insulating layer 22 is made of a 2-heptyl benzimidazole copper complex.

The present invention provides a self-assembled gate insulating layer composed of an azole-metal complex compound, which can be easily formed on a gate electrode of an OTFT. The azole-metal complex compound consists of metal ions (e.g. Cu, Cr, Mn, Fe, Co, Ni, Zn, Pd, Ag, Pt, Au, or Al) and azole anions (e.g. 2-heptyl benzimidazole, BIMH), and the metal of the azole-metal complex compound is a metal contained in the gate electrode. The method of making the self-assembled gate insulating layer is a water-based processing method that enables the azole-metal complex compound to be self-formed on the patterned gate electrode in a water-based solution and serves as a gate insulating layer. Therefore, there is no need of any process with expensive equipment (such as spin-coating process, jet-printing process, etc), since the process of producing an OTFT according to the present invention is simplified, and the costs of the raw materials and equipment are extremely low.

Example 2

Use the same methods and conditions of example 1 to sequentially form a gate electrode and an SABCC gate insulating layer on a PET substrate. Then, a source electrode and a drain electrode are formed on the SABCC gate insulating layer by a thermal evaporation method following with forming an organic semiconductor layer covering the source electrode, the drain electrode, and the SABCC gate insulating layer. Therefore, a bottom contact OTFT of the present example is provided.

Figure 4:
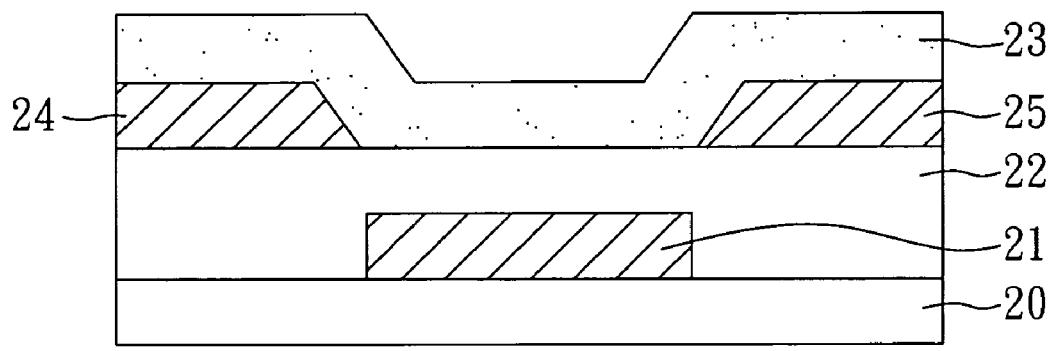
FIG. 4 is a schematic view of a bottom contact OTFT of the example 2 of the present invention.

Referring to FIG. 4, a bottom contact OTFT of the present example is shown, which comprises a substrate 20, a gate electrode 21, a gate insulating layer 22 formed on the gate electrode 21; a source electrode 24 and a drain electrode 25 formed on the gate insulating layer 22; and an organic semiconductor layer 23 formed on and covering the source electrode 24, the drain electrode 25, and the gate insulating layer 22.

Example 3

Figure 5:
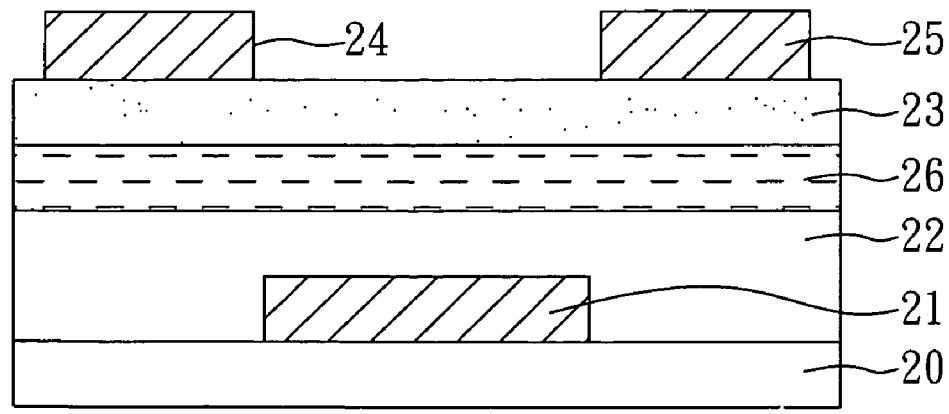
FIG. 5 is a schematic view of a top contact OTFT having a modification layer interposed between the gate insulating layer and the organic semiconductor layer of example 3 of the present invention.

Referring to FIG. 5, in the present example, except that a modification layer 26 is further formed between the gate insulating layer 22 and the organic semiconductor layer 23 to improve interfacial properties between the organic semiconductor layer 23 and the gate insulating layer 22, the same method as described in example 1 is used to provide a top contact OTFT of the present example. The modification layer 26 can be made of one selected from the group consisting of: polymethylmethacrylate (PMMA), poly(vinyl alcohol)

(PVA), poly(vinyl pyrrolidone) (PVNP), polyfluorene (PF), poly(vinylidene fluoride) (PVDF), polyimide (PI), polyethyleneimine (PEI), and polystyrene (PS). Herein, the modification layer is made of poly(vinyl alcohol) (PVA).

Example 4

A gate insulating layer of an OTFT is prepared in the same method as described in the example 1, except that 2-propyl benzimidazole is used instead of 2-heptyl benzimidazole.

Example 5

A gate insulating layer of an OTFT is prepared in the same method as described in the example 1, except that a mixture of 2-heptadecyl-4-methylimidazole and 2-heptadecyl-5-methyl benzimidazole is used instead of 2-heptyl benzimidazole.

Example 6

A gate insulating layer of an OTFT is prepared in the same method as described in the example 1, except that 2-heptylimidazole is used instead of 2-heptyl benzimidazole.

Example 7

A gate insulating layer of an OTFT having a modification layer is prepared in the same method as described in the example 3, except that the gate insulating layer is formed as described below.

Forming of the Gate Insulating Layer

An azole acidic solution is prepared by dissolving 2-(Naphthalen-2-ylmethyl) benzimidazole, formic acid, acetic acid in de-ionized (DI) water. The prepared azole acidic solution is kept in an acidic condition, and the concentration of the 2-(Naphthalen-2-ylmethyl) benzimidazole in the azole acidic solution is about 0.1 to 5%. At a temperature of 25° C. to 40° C., the above prepared glass substrate comprising the patterned gate electrode formed thereon is immersed in the azole acidic solution for 1 to 1.5 minutes. A self-assembled benzimidazole-copper complex (SABCC) gate insulating layer is thus self-forming on the patterned copper gate electrode.

Example 8

Forming of the Gate Electrode

A transparent glass substrate is ultrasonically cleaned with de-ionized (DI) water following by taken for thermal evaporation with a patterned mask. The conditions used during the thermal evaporation are listed below.

Pressure: $5 \times 10^{-6}$ torr;

Evaporating rate: 0.5 to 1 Å/s;

Thickness of the film: 50 to 100 nm.

After thermal evaporation, a patterned copper metallic film as the gate electrode is thus formed on the glass substrate.

Forming of the Gate Insulating Layer, which is Composed of Two Self-Assembled Benzimidazole-Copper Complex (SABCC) Layers Forming of the First SABCC Layer:

An azole acidic solution is prepared by dissolving 2-(Naphthalen-2-ylmethyl) benzimidazole, formic acid, acetic acid in de-ionized (DI) water. The prepared azole acidic solution is kept in an acidic condition, and the concentration of the 2-(Naphthalen-2-ylmethyl) benzimidazole is 0.1 to 5%. At a temperature of 25° C. to 40° C., the above prepared glass substrate comprising the patterned gate electrode formed thereon is immersed in the azole acidic solution for 1 to 1.5 minutes. A first SABCC layer is thus self-forming on the patterned copper gate electrode.

Forming of the Second SABCC Layer:

An azole acidic solution is prepared by dissolving 2-heptyl benzimidazole and acetic acid in de-ionized (DI) water, in which the pH value of the azole acidic solution is adjusted to 3, and the concentration of the 2-heptyl benzimidazole is 0.1 to 5%. At a temperature of 40° C., the above prepared glass substrate comprising the patterned gate electrode with SABCC1 layer formed thereon is immersed in the azole acidic solution for 1 to 1.5 minutes. A second SABCC layer is thus self-forming on the first SABCC layer.

Forming of the Organic Semiconductor Layer

The pentacene material obtained commercially is used as the material for forming the organic semiconductor layer of the present example. Through a shadow metal mask, pentacene is deposited on the SABCC gate insulating layers (i.e. the first SABCC layer and the second SABCC layer) by thermal evaporation at 70° C. The detailed conditions used during the deposition of the pentacene are listed below.

Pressure: $3 \times 10^{-6}$ torr;

Evaporating rate: 0.3 to 0.5 Å/s;

Thickness of the pentacene film: 100 nm.

Forming of the Source Electrode and the Drain Electrode

By using a thermal evaporation method, a patterned gold (Au) layer is deposited through a shadow metal mask to define a source electrode and a drain electrode. The conditions of the thermal evaporation processing are as listed below.

Pressure: $5 \times 10^{-6}$ torr;

Evaporating rate: 1 Å/s;

Thickness of the patterned gold (Au) layer film: 80 to 100 nm.

With the finishing of the above steps, a top contact OTFT of the present example is provided.

Figure 6:
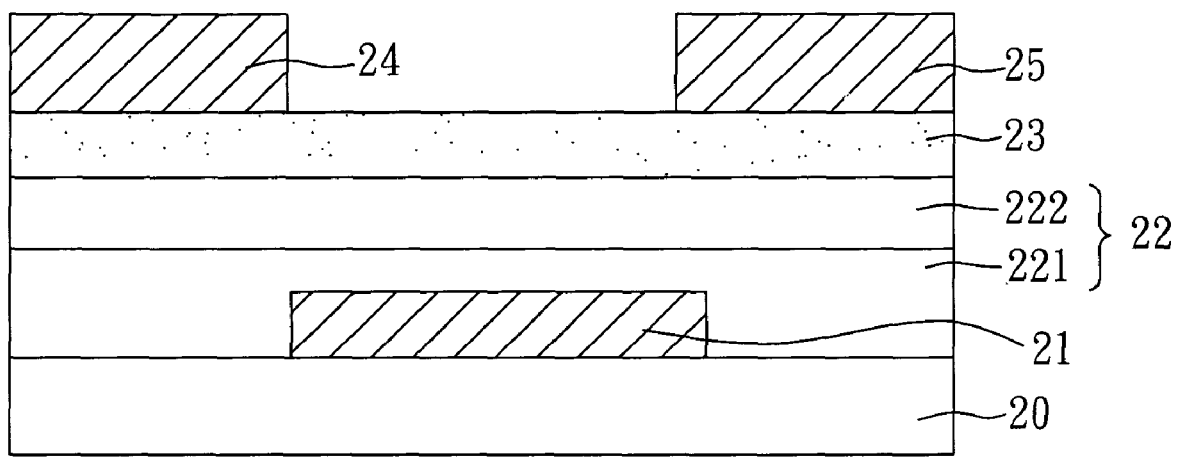
FIG. 6 is a schematic view of a top contact OTFT, in which the gate insulating layer is composed of two self-assembled benzimidazole-copper complex layers, the first self-assembled benzimidazole-copper complex layer and the second self-assembled benzimidazole-copper complex layer.

Reference with FIG. 6, a schematic view of a top contact OTFT of the present example is shown, in which the gate insulating layer 22 has a doubled-layered structure, and is composed of two SABCC layers, the first SABCC layer 221 and the second SABCC layer 222.

Testing Example 1

Figure 7:
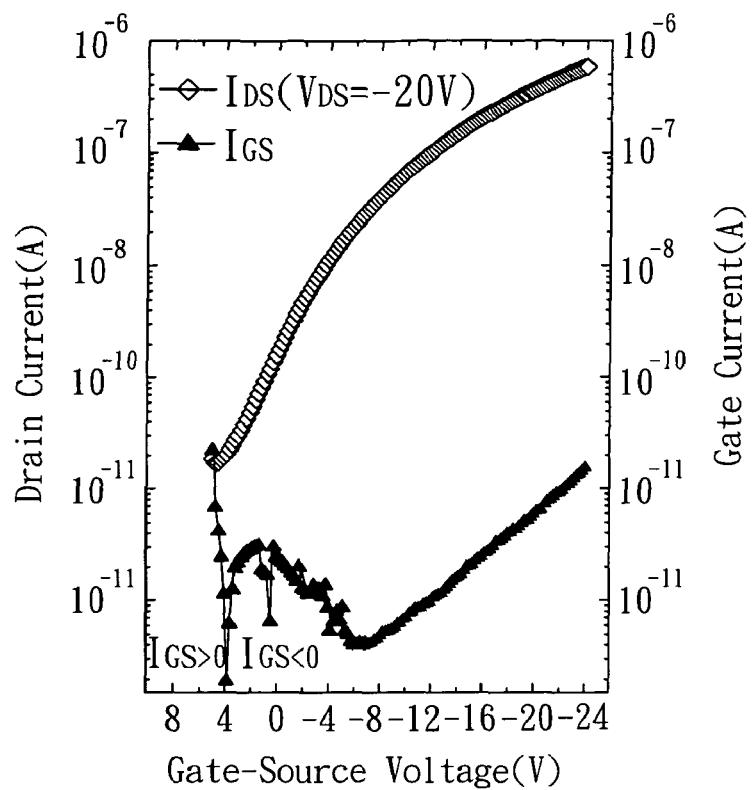
FIG. 7 is a current-voltage testing result showing the transfer characteristic with gate leakage current of the OTFT of example 1.
Figure 8:
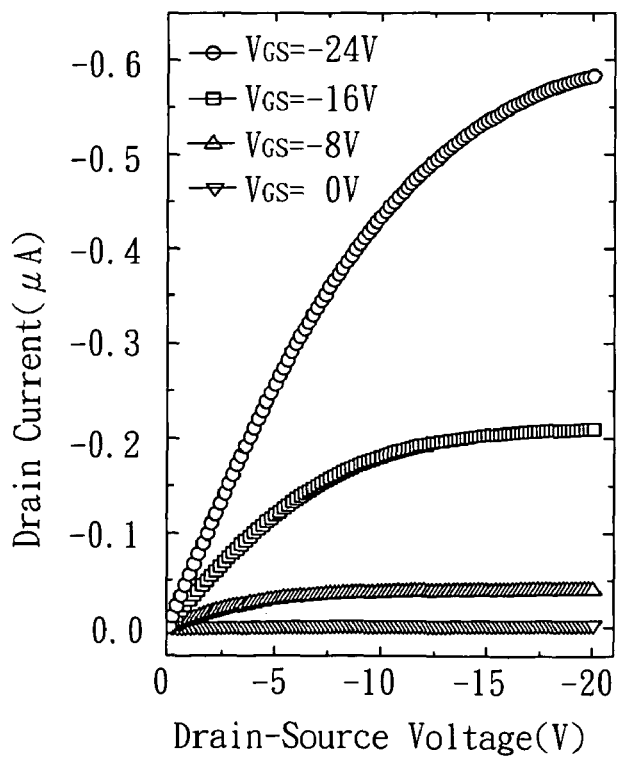
FIG. 8 is a current-voltage testing result showing the output characteristics of the OTFT of example 1.

A top contact OTFT produced from the example 1 is taken for current-voltage testing to evaluate whether the SABCC gate insulating layer is a proper gate insulating film for an OTFT device, and the results representing the output characteristics and the transfer characteristics are as shown in FIGS. 7 and 8 respectively. The parameters for characterizing device performances are on/off current ratio ($I_{ON/OFF}$), subthreshold swing (S.S.), and mobility.

Referring to FIGS. 7 and 8, it can be seen that the output curves exhibit typical OTFT characteristics that consist of very clear linear and saturation regions within the drain-source voltage ($V_{DS}$) of −20 V at a gate-source voltage ($V_{Gs}$) varying from 0 to −24 V at steps of −8 V. The mobility, subthreshold swing (S.S.), and field-effect on/off current ratio ($I_{ON/OFF}$) are determined to be 0.08 cm$^2$/vs, 4.4 V/decade, and $4 \times 10^3$ respectively from the transfer curve in FIG. 7, as listed in table 1.

TABLE 1

| | results |
|---|---|
| channel width | 600 μm |
| channel length | 125 μm |
| thickness of the gate insulating layer | ~350 nm |
| dielectric constant | ~3 |
| mobility | ~0.08 cm$^2$/vs |
| subthreshold swing (S.S.) | ~4.4 V/decade |
| field-effect on/off current ratio ($I_{ON/OFF}$) | ~4 × 10$^3$ |

Testing Example 2

Figure 9:
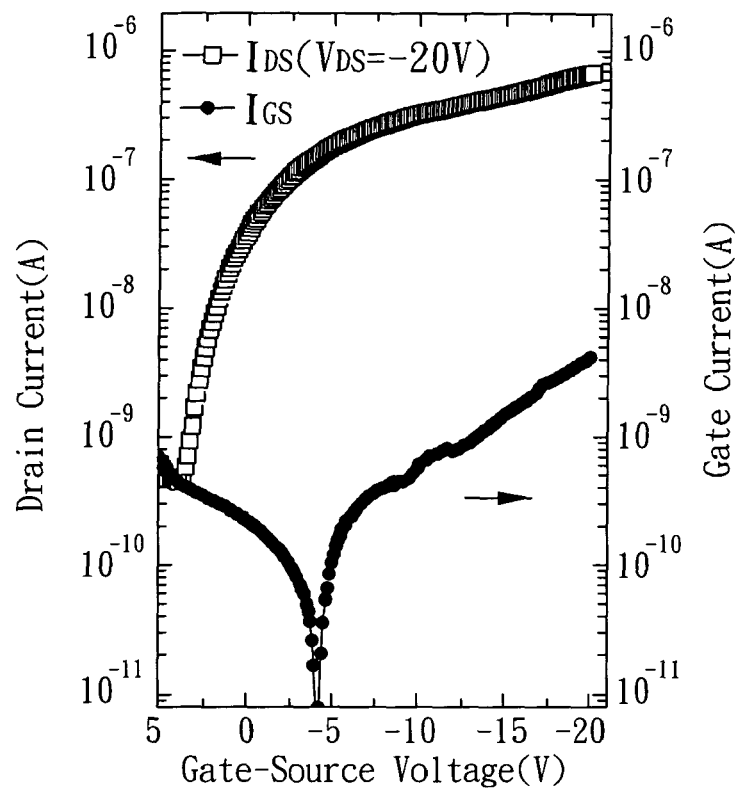
FIG. 9 is a current-voltage testing result showing the transfer characteristic with gate leakage current of the OTFT of example 3.
Figure 10:
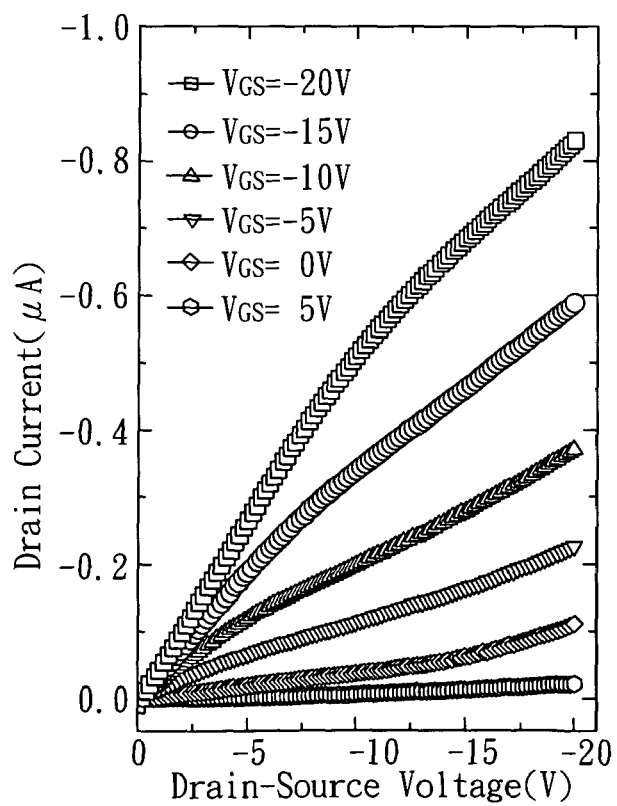
FIG. 10 is a current-voltage testing result showing the output characteristics of the OTFT of example 3.

A top contact OTFT having a modification layer of PVA produced from example 3 is taken for current-voltage testing to evaluate its electrical characteristics, and the results are shown in FIGS. 9 and 10, and table 2.

As revealed from the testing results, a typical OTFT characteristic is presented from the output curves shown in FIGS. 9 and 10. The mobility, subthreshold swing (S.S.), and field-effect on/off current ratio ($I_{ON/OFF}$) are determined to be 0.13 cm$^2$/vs, 1.49 V/decade, and 10$^3$ respectively.

TABLE 2

| | results |
|---|---|
| channel width | 600 μm |
| channel length | 125 μm |
| Capacitance per unit area | ~8.2 nF/cm$^2$ |
| mobility | ~0.13 cm$^2$/vs |
| subthreshold swing (S.S.) | ~1.49 V/decade |
| field-effect on/off current ratio ($I_{ON/OFF}$) | ~10$^3$ |

Testing Example 3

Figure 11:
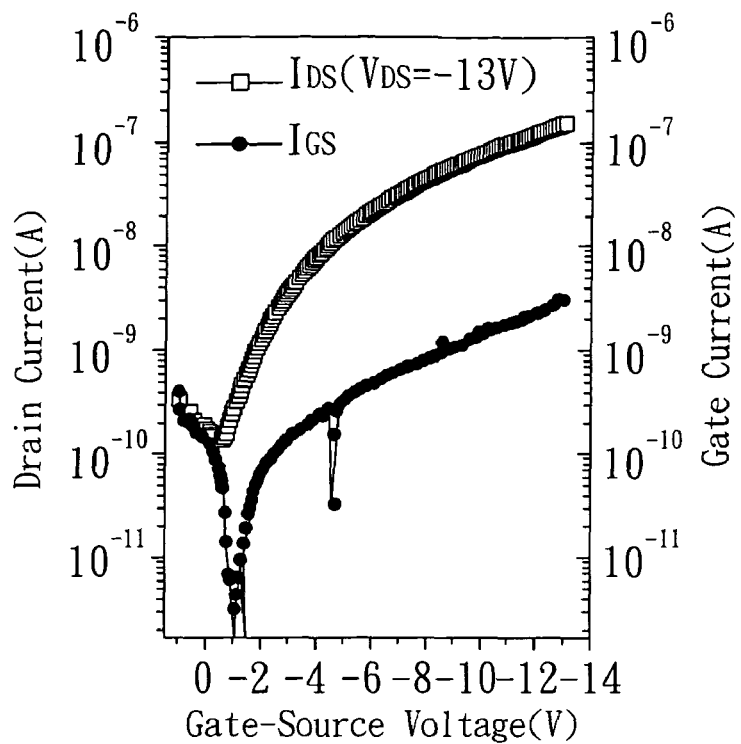
FIG. 11 is a current-voltage testing result showing the transfer characteristic with gate leakage current of the OTFT of example 7.
Figure 12:
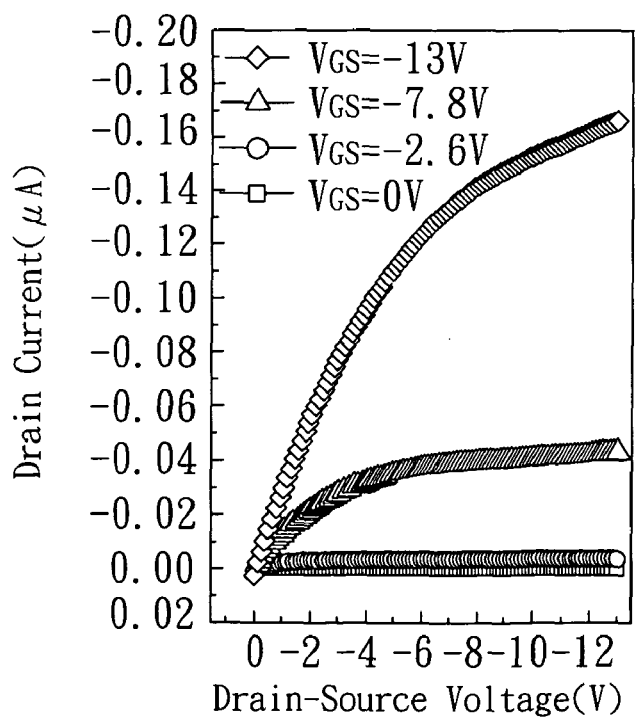
FIG. 12 is a current-voltage testing result showing the output characteristics of the OTFT of example 7.

A top contact OTFT produced from the example 7 is taken for current-voltage testing, and the results representing the output characteristics and the transfer characteristics are as shown in FIGS. 11 and 12 respectively.

As revealed from the testing results, a typical OTFT characteristic is presented from the output curves shown in FIGS. 11 and 12, and table 3. The mobility, subthreshold swing (S.S.), and field-effect on/off current ratio ($I_{ON/OFF}$) are determined to be 0.0196 cm$^2$/vs, 1.58 V/decade, and 4.7×10$^2$ respectively.

TABLE 3

| | results |
|---|---|
| channel width | 600 μm |
| channel length | 125 μm |
| Capacitance per unit area | ~22.8 nF/cm$^2$ |
| mobility | ~0.0196 cm$^2$/vs |
| subthreshold swing (S.S.) | ~1.58 V/decade |
| field-effect on/off current ratio ($I_{ON/OFF}$) | ~4.7 × 10$^2$ |

Testing Example 4

Figure 13:
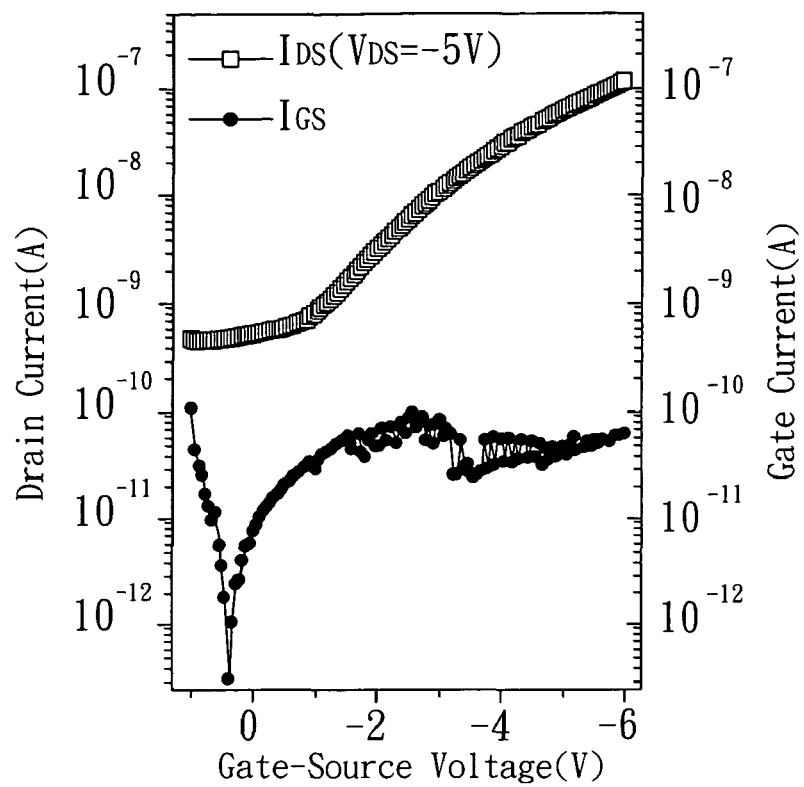
FIG. 13 is a current-voltage testing result showing the transfer characteristic with gate leakage current of the OTFT of example 8.
Figure 14:
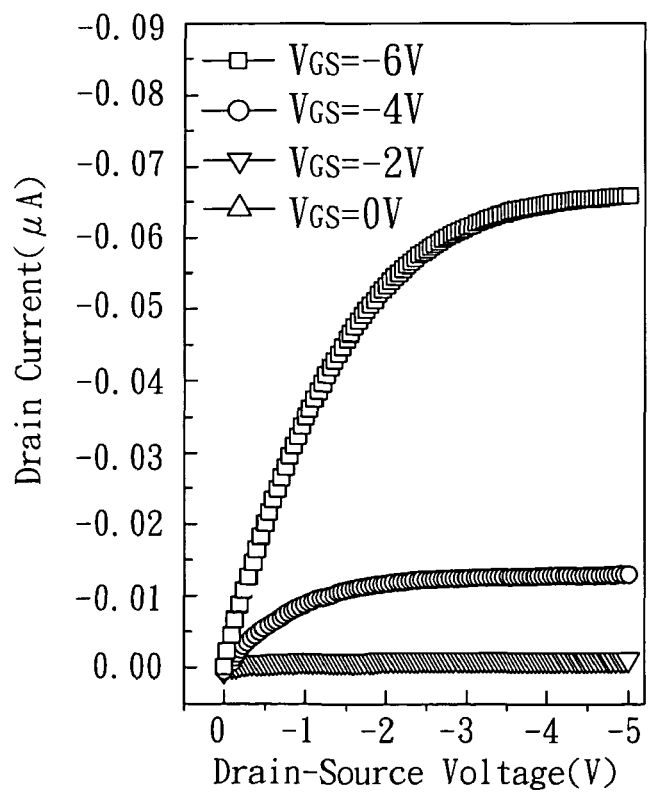
FIG. 14 is a current-voltage testing result showing the output characteristics of the OTFT of example 8.

A top contact OTFT produced from the example 8 is taken for current-voltage testing to evaluate whether the SABCC gate insulating layer is a proper gate insulating film for an OTFT device, and the results representing the output characteristics and the transfer characteristics are as shown in FIGS. 13 and 14 respectively.

As revealed from the testing results, a typical OTFT characteristic is presented from the output curves shown in FIGS. 13 and 14, and table 4. The mobility, subthreshold swing (S.S.), and field-effect on/off current ratio ($I_{ON/OFF}$) are determined to be 0.087 cm$^2$/vs, 1.8 V/decade, and 2.3×10$^2$ respectively.

TABLE 4

| | results |
|---|---|
| channel width | 600 μm |
| channel length | 75 μm |
| Capacitance per unit area | ~20.33 nF/cm$^2$ |
| mobility | ~0.087 cm$^2$/vs |
| subthreshold swing (S.S.) | ~1.8 V/decade |
| field-effect on/off current ratio ($I_{ON/OFF}$) | ~2.3 × 10$^2$ |

The present invention provides a method of fabricating a gate insulating layer of an OTFT with low cost, simple, low temperature, and environmentally-friendly processes. The method of making the self-assembled gate insulating layer is a water-based processing method that enables the azole-metal complex compound to be self-formed on the patterned gate electrode in a water-based solution without the use of coating or printing process. In this connection, the method of the present invention enables the fabrication of an insulating layer to be processed in a simple way and the equipment utilized herein is low cost, which cannot be obtained by the prior arts.

Although the present invention has been explained in relation to its preferred embodiment, it is to be understood that many other possible modifications and variations can be made without departing from the scope of the invention as hereinafter claimed.

What is claimed is:

1. An organic thin film transistor comprising:
   a substrate;
   a gate electrode located on the substrate;
   a gate insulating layer located on the gate electrode, wherein the gate insulating layer comprises an azole-metal complex compound;
   a source electrode;
   a drain electrode; and
   an organic semiconductor layer;
   wherein the source electrode, the drain electrode, and the organic semiconductor layer are located over the gate insulating layer.

2. The organic thin film transistor as claimed in claim 1, wherein the azole-metal complex compound is selected from the group consisting of: an imidazole-metal complex compound, a benzimidazole-metal complex compound, a benzotriazole-metal complex compound, and the mixture thereof.

3. The organic thin film transistor as claimed in claim 2, wherein the azole-metal complex compound is a 2-substituted benzimidazol-metal complex.

4. The organic thin film transistor as claimed in claim 1, wherein the metal of the azole-metal complex compound is a metal contained in the gate electrode, and the metal of the azole-metal complex compound is selected from the group consisting of: Cu, Cr, Mn, Fe, Co, Ni, Zn, Pd, Ag, Pt, Au, and Al.

5. The organic thin film transistor as claimed in claim 1, wherein the organic thin film transistor is a top contact organic thin film transistor, in which the organic semiconductor layer covers the whole gate insulating layer, and the source electrode and the drain electrode locate on the organic semiconductor layer.

6. The organic thin film transistor as claimed in claim 1, wherein the organic thin film transistor is a bottom contact organic thin film transistor, in which the source electrode and the drain electrode locate on the gate insulating layer, and the organic semiconductor layer covers the source electrode, the drain electrode, and the gate insulating layer.

7. The organic thin film transistor as claimed in claim 1, further comprising a modification layer located between the gate insulating layer and the organic semiconductor layer.

8. The organic thin film transistor as claimed in claim 7, wherein the modification layer is made of one selected from the group consisting of: polymethylmethacrylate (PMMA), poly(vinyl alcohol) (PVA), poly(vinyl pyrrolidone) (PVNP), polyfluorene (PF), poly(vinylidene fluoride) (PVDF), polyimide (PI), polyethyleneimine (PEI), and polystyrene (PS).

9. The organic thin film transistor as claimed in claim 1, wherein the gate electrode is made of one selected from the group consisting of: Cu, Cr, Mn, Fe, Co, Ni, Zn, Pd, Ag, Pt, Au, and Al.

10. The organic thin film transistor as claimed in claim 1, wherein the gate insulating layer has a multi-layered structure.

11. A gate insulating layer, which comprises:
an azole-metal complex compound,
wherein the gate insulating layer is used in an organic thin film transistor, the metal of the azole-metal complex compound is a metal contained in the gate electrode, and the metal of the azole-metal complex compound is selected from the group consisting of: Cu, Cr, Mn, Fe, Co, Ni, Zn, Pd, Ag, Pt, Au, and Al.

12. The gate insulating layer as claimed in claim 11, wherein the azole-metal complex compound is selected from the group consisting of: an imidazole-metal complex compound, a benzimidazole-metal complex compound, a benzotriazole-metal complex compound, and the mixture thereof.

13. The gate insulating layer as claimed in claim 12, wherein the azole-metal complex compound is a 2-substituted benzimidazol-metal complex.

\* \* \* \* \*